(12) United States Patent
Javora

(10) Patent No.: US 12,078,655 B2
(45) Date of Patent: Sep. 3, 2024

(54) VOLTAGE SENSOR FOR HIGH AND MEDIUM VOLTAGE USE AND A METHOD OF MAKING THE SAME

(71) Applicant: ABB Schweiz AG, Baden (CH)

(72) Inventor: Radek Javora, Brno (CZ)

(73) Assignee: ABB Schweiz AG, Baden (CH)

( * ) Notice: Subject to any disclaimer, the term of this patent is extended or adjusted under 35 U.S.C. 154(b) by 443 days.

(21) Appl. No.: 16/291,645

(22) Filed: Mar. 4, 2019

(65) Prior Publication Data

US 2019/0257856 A1 Aug. 22, 2019

Related U.S. Application Data

(62) Division of application No. 14/722,616, filed on May 27, 2015, now abandoned.

(30) Foreign Application Priority Data

May 27, 2014 (EP) .................................... 14001838

(51) Int. Cl.
| | | |
|---|---|---|
| *G01R 1/04* | (2006.01) | |
| *G01R 15/04* | (2006.01) | |
| *G01R 15/16* | (2006.01) | |
| *H01H 33/662* | (2006.01) | |

(52) U.S. Cl.
CPC .............. *G01R 1/04* (2013.01); *G01R 15/04* (2013.01); *G01R 15/16* (2013.01); *H01H 33/66207* (2013.01); *H01H 2033/66223* (2013.01); *Y10T 29/49009* (2015.01)

(58) Field of Classification Search
CPC ........... G01R 1/04; G01R 15/04; G01R 15/16
See application file for complete search history.

(56) References Cited

U.S. PATENT DOCUMENTS

| | | |
|---|---|---|
| 3,515,798 A | 6/1970 | Sievert |
| 3,985,981 A | 10/1976 | Weirick et al. |
| 4,045,604 A | 8/1977 | Clabburn |

(Continued)

FOREIGN PATENT DOCUMENTS

| | | |
|---|---|---|
| CN | 2689243 Y | 3/2005 |
| CN | 1246862 C | 3/2006 |

(Continued)

OTHER PUBLICATIONS

European Search Report dated Aug. 26, 2014; European Application No. 14001838.3; Applicant: ABB Technology AG; 6 pgs.

(Continued)

*Primary Examiner* — Paresh Patel
(74) *Attorney, Agent, or Firm* — Leydig, Voit & Mayer, Ltd.

(57) ABSTRACT

A voltage sensor is disclosed for high and medium voltage use, wherein a voltage divider is arranged in a housing with external creepage distance enlarging ribs. To implement structures for creepage path enlargement to a sensor housing in a very effective and easy way, the voltage divider is arranged in a housing or in housing modules which is or are covered at least partly by at least one shrinking tube of insulating material such that the shrinking creepage enlarging structures are implemented at least at outer surface of the shrinking tube.

12 Claims, 4 Drawing Sheets

(56) References Cited

U.S. PATENT DOCUMENTS

| | | | |
|---|---|---|---|
| 4,507,701 A * | 3/1985 | Fujiwara | H01C 7/12 |
| | | | 324/102 |
| 4,714,800 A | 12/1987 | Atkins et al. | |
| 4,963,819 A | 10/1990 | Clarke et al. | |
| 5,098,752 A | 3/1992 | Chang et al. | |
| 5,298,301 A | 3/1994 | Midgley et al. | |
| 5,698,831 A | 12/1997 | Abdelgawad et al. | |
| 5,746,253 A | 5/1998 | Dust et al. | |
| 6,362,427 B1 | 3/2002 | Daoud et al. | |
| 6,850,399 B1 * | 2/2005 | Kato | G01R 15/142 |
| | | | 361/132 |
| 7,635,813 B2 * | 12/2009 | Taylor | H02G 15/24 |
| | | | 174/74 R |
| 9,766,272 B2 * | 9/2017 | Chatrefou | G01R 15/06 |
| 2005/0122122 A1 * | 6/2005 | Yakymyshyn | G01R 15/06 |
| | | | 324/705 |
| 2006/0012382 A1 * | 1/2006 | Yakymyshyn | G01R 15/06 |
| | | | 324/705 |
| 2013/0033267 A1 | 2/2013 | Harley et al. | |
| 2014/0125320 A1 | 5/2014 | Fong et al. | |
| 2014/0370741 A1 * | 12/2014 | Bolcato | G01R 15/16 |
| | | | 439/471 |
| 2015/0145502 A1 * | 5/2015 | Javora | G01R 19/0084 |
| | | | 324/156 |
| 2016/0005511 A1 * | 1/2016 | Gravermann | H01B 7/17 |
| | | | 29/829 |
| 2017/0184634 A1 * | 6/2017 | Wentzel | G01R 15/146 |

FOREIGN PATENT DOCUMENTS

| | | | |
|---|---|---|---|
| CN | 102027314 A | | 4/2011 |
| CN | 103038965 A | | 4/2013 |
| CN | 202994878 U | | 6/2013 |
| CN | 103366907 A | | 10/2013 |
| CN | 203365523 U | | 12/2013 |
| CN | 103558440 A | | 2/2014 |
| DE | 3742610 C1 | | 9/1989 |
| EP | 0172634 A1 | | 2/1986 |
| EP | 2608338 A1 | | 6/2013 |
| EP | 2693223 A1 | | 2/2014 |
| EP | 2696206 A1 | | 2/2014 |
| FR | 2698695 A1 | | 6/1994 |
| KR | 20040082815 A | * | 9/2004 |
| WO | 9116564 A1 | | 10/1991 |

OTHER PUBLICATIONS

European Patent Office, Communication Pursuant to Article 94(3) EPC issued in corresponding European application No. 140018383, dated Mar. 30, 2021, 8 pp.

* cited by examiner

VOLTAGE SENSOR FOR HIGH AND MEDIUM VOLTAGE USE AND A METHOD OF MAKING THE SAME

RELATED APPLICATION

This application claims priority under 35 U.S.C. § 119 to European Patent Application No. 14001838.3 filed in Europe on May 27, 2014, the entire content of which is hereby incorporated by reference in its entirety.

FIELD

The present disclosure relates to a voltage sensor for high and medium voltage use, and a method of making the same.

BACKGROUND INFORMATION

Known voltage sensors use an impedance divider cast in some insulation material (epoxy or polyurethane) in order to withstand voltage stresses on MV or HV lines. This solution is expensive and involves investment into a complex mold for casting, such as when the requirement of creepage distance is of importance and ribs on the sensor body are used to achieve given creepage distance, such as in FIG. 1.

SUMMARY

A voltage sensor for high and medium voltage use is disclosed, comprising: a voltage divider arranged in a housing or housing modules with external shrinking creepage distance enlarging structures; and the voltage divider being arranged in the housing or in housing modules which is or are covered at least partly by at least one shrinking tube of insulating material such that the shrinking creepage distance enlarging structures are implemented at least at an outer surface of the shrinking tube.

A method for producing a voltage sensor is disclosed, comprising: covering a tubelike solid housing in which a voltage divider of a sensor is placed, or an output cable of the voltage divider, by a flexible tube of insulating cold shrink material with implemented ribs structures, a diameter or resulting diameter of the housing or the cable being smaller than an inner diameter of the flexible tube in an unextended state; extending the flexible tube in diameter by an extrusion device to position it over the housing or the cable; removing the extension device when the flexible tube is positioned over the housing or the cable; and shrinking the flexible tube close on a surface of the housing or the cable.

A method for producing a voltage sensor is disclosed, comprising: covering a tubelike solid housing in which a voltage divider of a sensor is placed, or an output cable of the voltage divider, by a flexible tube of insulating warm shrink material with implemented rib structures, a diameter or resulting diameter of the housing or the cable being larger than an inner diameter of the flexible tube in an unshrunken state; positioning the flexible tube over the housing or the cable; and shrinking the flexible tube under heat treatment close on a surface of the housing or the cable.

BRIEF DESCRIPTION OF THE DRAWINGS

Features and advantages disclosed herein will become apparent from the description of the exemplary embodiments when read in conjunction with the drawings, wherein.

DETAILED DESCRIPTION

Structures for creepage distance enlargement are disclosed herein which can be used with a sensor housing in a very effective and easy way.

Figure 4:
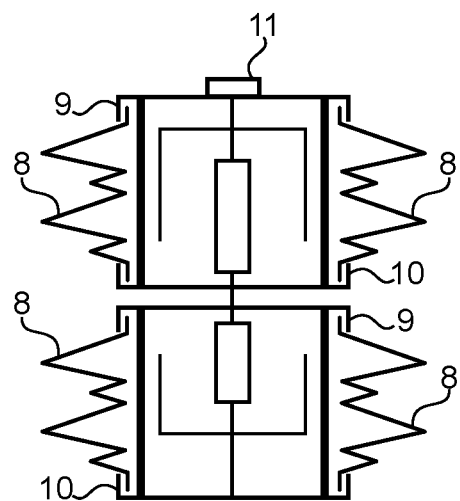
FIG. 4 shows housing modules as disclosed herein.

According to exemplary embodiments, the voltage divider can be arranged in a housing or in housing modules (FIG. 4) which is or are covered at least partly by at least one shrinking tube of insulating material such that the shrinking creepage distance enlarging structures are implemented at least at the outer surface of the shrinking tube.

In exemplary embodiments, a standard shrinking tube with sheds can be used, which is shrunken around a voltage divider module. This solution can provide significant cost saving in mold investments and reduction on sensor costs as well as significant reduction on manufacturing time of such solution.

Exemplary embodiments can reduce manufacturing time and effort and decrease production costs and investments needed for production. By using standard shrinking tube with sheds, which is shrunken around a voltage divider module, significant cost saving in mold investments and reduction in sensor costs as well as significant reduction on manufacturing time of such solution can be realized as mentioned.

In an exemplary embodiment, the shrinking tube can be placed on the housing of the voltage divider near the distal ends of the housing, and/or at least partly over an output cable of the voltage sensor. An exemplary embodiment is to cover the definite transition area between the housing and the output cable, in order to implement at that place a creepage distance enlargement.

In an exemplary embodiment, the voltage sensor is located within or surrounded by shielding electrodes, which are arranged inside or outside the voltage divider housing.

In an exemplary embodiment, the voltage divider part is cast in simple shape and the insulation is done by insulating material; e.g., epoxy, polyurethane or similar.

According to an exemplary embodiment, the insulating shrinking tube can be provided as a cold shrink tube, by the use of insulating cold shrinking material.

Alternatively but also advantageous is that the insulating shrinking tube can be provided as a warm shrink tube, by the use of insulating warm shrinking material.

So the same effect of implementing creepage distance enlargement can be placed on a sensor's housing or cable, in both cases in a very simple way of manufacture.

A voltage sensor with the features disclosed herein can, for example, be used for indoor use.

But the same advantages of using a voltage sensor with the features disclosed herein can be realized in a sensor provided for outdoor use.

According to the voltage sensor construction disclosed herein, implementation of local creepage distance enlargement element structures can be realized, and a simplified method for producing voltage sensors can be realized. According to an exemplary method of manufacture, a tubelike solid housing in which the voltage divider of the sensor is placed, or an output cable of the voltage divider, is covered by a flexible tube of insulating cold shrink material with implemented rib structures such that the diameter or resulting diameter of the aforesaid housing or the aforesaid cable is bigger (i.e., larger) than the inner diameter of the unextended flexible tube. The flexible tube can be extended in its diameter by an extending means (such as any suitable extension device structure or mechanism), in order to position it over the housing or the cable, and these extending means can be removed when the flexible tube is positioned over the housing or the cable, so that the flexible tube shrinks close on the surface of the housing or the cable.

Figure 5:
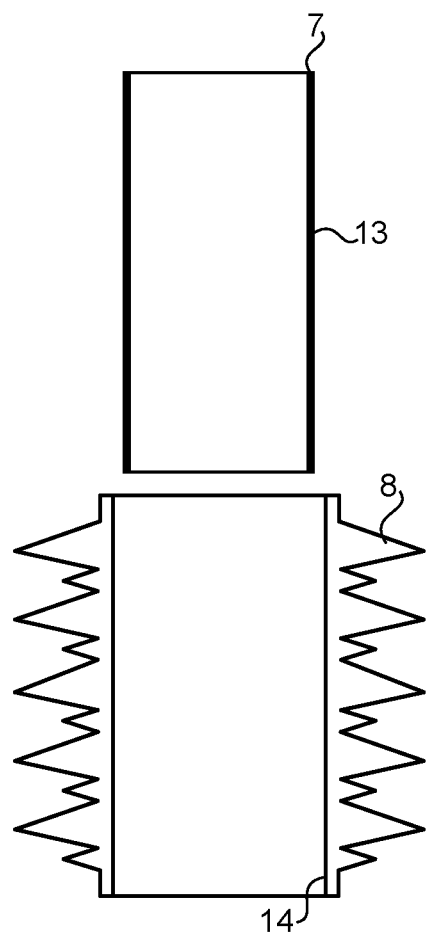
FIG. 5 shows diameters of the housing and unshrunken tube as disclosed herein.

An alternative method for manufacture includes, for example, a tubelike solid housing in which the voltage divider of the sensor is placed, or an output cable of the voltage divider, being covered by a flexible tube of insulating warm shrink material with implemented rib structures. The diameter or the resulting diameter of the aforesaid housing 7 or the aforesaid cable is smaller than the inner diameter 14 of the unshrunken flexible tube 8 (FIG. 5), and the flexible tube will be positioned over the housing or the cable, and the flexible tube shrinks under heat treatment close on the surface of the housing or the cable.

Figure 1:
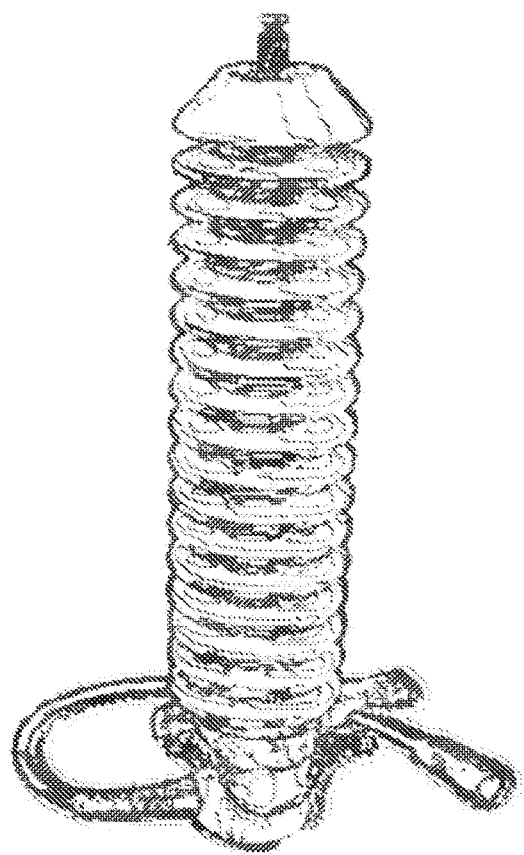
FIG. 1 shows a known exemplary cast voltage divider.
Figure 2A:
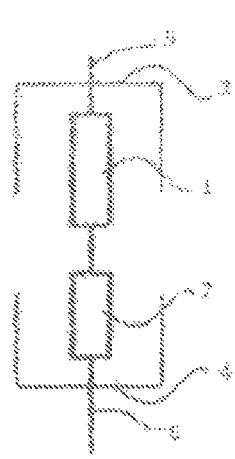
FIG. 2A-2C show an exemplary voltage divider as disclosed herein.

As shown in FIG. 2A, the design of a standard voltage divider is illustrated as having high voltage impedance 1 and low voltage impedance 2. Depending on electrical design and electric field distribution, such a voltage divider may also include high voltage electrode 3 and/or low voltage electrode 4. Such divider can be cast in some insulation material as shown in FIG. 1 as state of the art.

The voltage divider can be of capacitive or resistive type, or a combination of both.

Figure 2B:
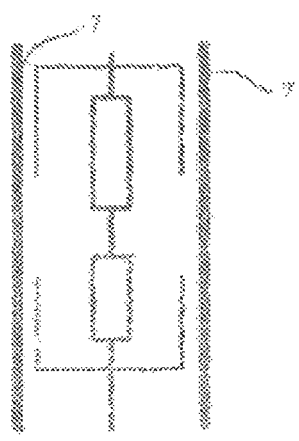
Figure 2C:
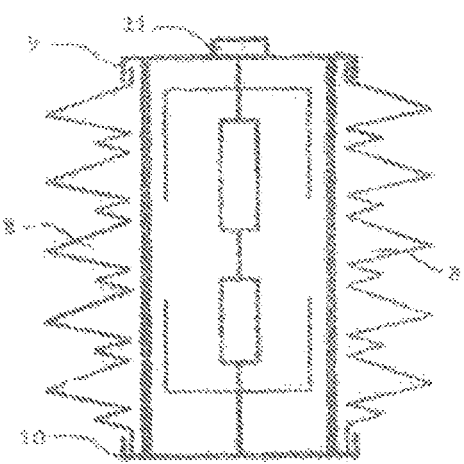

Exemplary embodiments disclosed herein can include a design of a voltage sensor which does not involve such a casting process to form the final shape of the voltage sensor. Instead, it is proposed that voltage divider internal parts shown in FIG. 2A can be cast in a simple insulating tube 7 of FIG. 2B or other shape of insulating material and then the shrinking tube, forming the ribs/insulator sheds 8, is applied on top as shown in FIG. 2C. The shrinking tube may be applied using for example, hot or cold shrinking tube technology. In order to cover the ends of shrinking tube, upper 9 and lower 10 cups could be used if needed.

Depending on a final electric field distribution inside of the sensor, the upper 9 and lower 10 cups, if made of electrically conductive material, can replace the high voltage electrode 3 and/or low voltage electrode 4.

Figure 3:
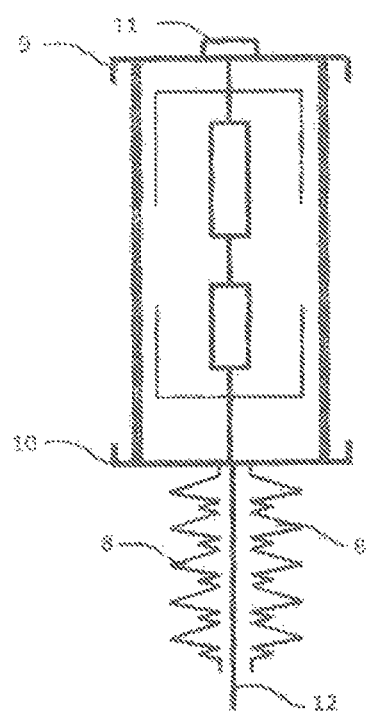
FIG. 3 shows another exemplary embodiment of a voltage divider as disclosed herein.

Another exemplary embodiment to increase the creepage distance can include not using the shrinking tube 8 on a simple body, but to apply the shrinking tube with ribs on the output cable 12 instead as shown in FIG. 3. In this case the lower cup 10 should not be connected to the ground potential.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

NUMBERING

1 High voltage impedance
2 Low voltage impedance
3 High voltage electrode
4 Low voltage electrode
5 Cable
6 Cable
7 Insulating tube
8 Ribs/insulator sheds
9 Upper cup
10 Lower cup
11 Primary terminal to which the voltage to be measured is connected/applied
12 Output cable

The invention claimed is:

1. A voltage sensor for high and medium voltage use, comprising:
   a voltage divider comprising a high voltage impedance, a low voltage impedance, a high voltage electrode, and a low voltage electrode, wherein the high voltage impedance and the low voltage impedance are disposed within a housing;
   an output cable electrically connected to the low voltage electrode;
   a shrinking tube of insulating material with creepage distance enlarging structures on an outer surface of the output cable, wherein the creepage distance enlarging structures are ribs or sheds that are an integral part of the shrinking tube; and
   a first shielding electrode forming an upper cup at one end of the housing and shielding above and circumferentially around a first end of the housing and a second shielding electrode forming a lower cup at an opposite end of the housing and shielding below and circumferentially around a second end of the housing, the second shielding electrode not being connected to ground potential but comprising an opening to allow the output cable to pass through axially,
   wherein the first and second shielding electrodes comprise an electrically conductive material.

2. The voltage sensor according to claim 1, wherein the voltage divider is cast in an epoxy or polyurethane insulation material.

3. The voltage sensor according to claim 1, configured for indoor use.

4. The voltage sensor according to claim 1, configured for outdoor use.

5. A method for producing a voltage sensor, comprising:
   providing a housing in which a voltage divider of a sensor is placed, the voltage divider comprising a high voltage impedance, a low voltage impedance, a high voltage electrode, and a low voltage electrode, and an output cable electrically connected to the low voltage electrode, wherein the high voltage impedance and the low voltage impedance are disposed within the housing;
   covering the output cable with a shrinking tube of insulating material with creepage distance enlarging structures;
   shrinking the flexible tube onto the output cable; and
   shielding above and circumferentially around a first end of the housing with a first shielding electrode forming an upper cup at one end of the housing and shielding below and circumferentially around a second end of the housing with a second shielding electrode forming a lower cup at an opposite end of the housing, the second shielding electrode not being connected to ground potential but comprising an opening to allow the output cable to pass through axially,
   wherein the first and second shielding electrodes comprise an electrically conductive material.

6. The method according to claim 5, wherein the voltage divider is cast in an epoxy or polyurethane insulation material.

7. The method according to claim 5, configured for indoor use.

8. The method according to claim 5, configured for outdoor use.

9. A voltage sensor for high and medium voltage use, comprising:
- an insulating tube;
- an upper cup;
- a lower cup that is not connected to ground potential;
- a voltage divider;
- an output cable that is not electrically connected to a ground potential passes axially through the lower cup; and
- a flexible tube of insulating shrink material with ribs or sheds on an outer surface;
- wherein the voltage divider comprises a high voltage impedance, a low voltage impedance, a high voltage electrode, and a low voltage electrode that is electrically connected to the output cable;
- wherein the voltage divider is located within the insulating tube;
- wherein the flexible tube of insulating shrink material with ribs or sheds has been shrunk onto the output cable;
- wherein the insulating tube comprises a first end and a second end opposite to the first end;
- wherein the upper cup covers the first end of the insulating tube;
- wherein the lower cup covers the second end of the insulating tube;
- and wherein all portions of the upper cup and the lower cup comprise electrically conductive material.

10. The voltage sensor according to claim 9, wherein the voltage divider part is cast in epoxy insulating material, or polyurethane insulating material.

11. The voltage sensor according to claim 9, wherein the voltage sensor is configured for indoor use.

12. The voltage sensor according to claim 9, wherein the voltage sensor is configured for outdoor use.

* * * * *